(12) United States Patent
Venkatasubramanian et al.

(10) Patent No.: US 12,205,636 B2
(45) Date of Patent: Jan. 21, 2025

(54) WRITE ASSIST CIRCUIT FOR STATIC RANDOM-ACCESS MEMORY (SRAM)

(71) Applicant: Samsung Electronics Co., Ltd., Suwon-si (KR)

(72) Inventors: Poornima Venkatasubramanian, Bengaluru (IN); Pushp Khatter, Bengaluru (IN); Lava Kumar Pulluru, Bengaluru (IN); Manish Chandra Joshi, Bengaluru (IN); Ved Prakash, Bengaluru (IN); Anurag Kumar, Bengaluru (IN); Surendra Deshmukh, Bengaluru (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 169 days.

(21) Appl. No.: 18/163,584

(22) Filed: Feb. 2, 2023

(65) Prior Publication Data

US 2024/0161821 A1 May 16, 2024

(30) Foreign Application Priority Data

Nov. 16, 2022 (IN) .............................. 202241065577

(51) Int. Cl.
  *G11C 11/00* (2006.01)
  *G11C 11/412* (2006.01)
  *G11C 11/419* (2006.01)
(52) U.S. Cl.
  CPC .......... *G11C 11/419* (2013.01); *G11C 11/412* (2013.01)

(58) Field of Classification Search
  CPC .... G11C 11/419; G11C 11/412; G11C 11/417
  USPC .......................................................... 365/156
  See application file for complete search history.

(56) References Cited

U.S. PATENT DOCUMENTS

| | | | | |
|---|---|---|---|---|
| 5,159,571 A * | 10/1992 | Ito | ........................... | G11C 29/36 365/201 |
| 5,365,475 A * | 11/1994 | Matsumura | .............. | G11C 5/14 365/104 |
| 5,956,279 A * | 9/1999 | Mo | ......................... | G11C 29/34 365/201 |
| 6,385,081 B1 * | 5/2002 | Shiomi | ................... | G11C 29/50 365/201 |
| 7,433,224 B1 * | 10/2008 | Dunlap | ................. | G11C 11/412 365/103 |
| 8,320,164 B2 | 11/2012 | Chuang et al. | | |

(Continued)

*Primary Examiner* — Tha-O H Bui
(74) *Attorney, Agent, or Firm* — Harness, Dickey & Pierce, P.L.C.

(57) ABSTRACT

A write assist circuit includes a first power control circuit and second power control circuit, each comprising a first switch and second switch. The first switch of first power control circuit has first drive strength and is configured to be controlled by a column select line, a power control line, a first bit line, and a power supply. The first switch of the second power control circuit has the first drive strength and is configured to be controlled by the column select line, the power control line, a second bit line, and the power supply. The second switch has a second drive strength and is configured to be controlled by the power control line. The first switches are configured to be controlled using input data on first- and second-bit line, respectively, for altering power supply to first inverter and second inverter of SRAM bitcell.

14 Claims, 9 Drawing Sheets

(56) References Cited

U.S. PATENT DOCUMENTS

| | | | |
|---|---|---|---|
| 8,526,261 B2 * | 9/2013 | Chen | G11C 8/08 365/201 |
| 9,865,334 B2 | 1/2018 | Sonkar | |

* cited by examiner

FIG. 5

WRITE ASSIST CIRCUIT FOR STATIC RANDOM-ACCESS MEMORY (SRAM)

CROSS-REFERENCE TO RELATED APPLICATIONS

This application claims the benefit of Indian Patent Application No. 202241065577, filed on Nov. 16, 2022, in the Indian Patent Office, the disclosures of which is incorporated herein in its entirety by reference.

BACKGROUND

Various example embodiments generally relate to memory circuits. More particularly, various example embodiments relate to a write assist circuit for Static Random-Access Memory (SRAM).

Advancement in semiconductor technology is leading to development of low-power, low-voltage, and/or high-speed devices. For instance, such technology is used in microprocessors, servers, processors used in devices that require or use high-speed computing (for example, processors in smartphones, artificial intelligence processors), and the like. With the advancement in the semiconductor technology, low operating voltage is desired. Static Random-Access Memory (SRAM) circuits are used as memory circuits in such high-speed devices, for storing data. A strength of a bitcell inside the SRAM is an important parameter for writing the data into the SRAM. The strength of the bitcell is affected by inherent process variations. The effect of such variations may be more in advanced technology nodes. For instance, a variation in threshold voltage and/or size of a device due to miniaturization may affect the strength of the bitcell. The strength of the bitcell impacts or directly impacts write margin e.g., the ability to write the data into the SRAM, by altering time required to complete write operation. This may limit the write performance of the SRAM. There is a compromise between the write margin and operating voltage of the SRAM. Hence, write assist techniques are used to improve the write margin of the SRAM.

Conventional write assist techniques include negative bit line scheme in which a negative voltage is used to increase strength of a transistor in the bitcell. Other conventional write assist techniques use bitcell supply voltage collapse method to help in faster writing of data to the SRAM. Some other conventional write assist techniques use N-channel Metal-Oxide Semiconductor (NMOS) pull down and P-channel Metal-Oxide Semiconductor (PMOS) pull up to pull down supply voltage based on data present on bit lines. In such techniques, there is a contention since both the NMOS pull down and PMOS pull up are in ON state during the write operation. This leads in increase of dynamic power consumption.

The information disclosed in this background of the disclosure section is only for enhancement of understanding of the general background and should not be taken as an acknowledgement or any form of suggestion that this information forms the prior art already known to a person of ordinary skill in the art.

SUMMARY

Some example embodiments provide a write assist circuit for Static Random-Access Memory (SRAM). The write assist circuit comprises a first power control circuit connected to a first circuit of a SRAM bitcell. The first circuit comprises a first inverter. Further, the write assist circuit comprises a second power control circuit connected to a second circuit of the SRAM bitcell. The second circuit comprises a second inverter. Each of the first power control circuit and the second power control circuit comprises a first switch and a second switch. The first switch associated with the first power control circuit has a first drive strength. The first switch associated with the first power control is configured to be controlled by a column select line, a power control line, a first bit line, and a power supply. The first switch associated with the second power control circuit has the first drive strength. The first switch associated with the second power control circuit is controlled by the column select line, the power control line, a second bit line, and the power supply. The second switches associated with each of the first power control circuit and the second power control circuit have the second drive strength. The second switch is configured to be controlled by the power control line. The first switch associated with the first power control circuit and the second power control circuit are configured to be controlled using input data present on the first bit line and the second bit line, respectively, for altering the power supply to the first inverter and the second inverter, respectively, so as to assist in writing the input data into the SRAM.

Some example embodiments provide a write assist circuit for Static Random-Access Memory (SRAM). The write assist circuit comprises a first power control circuit connected to a first circuit of a SRAM bitcell. The first circuit comprises a first inverter. Further, the write assist circuit comprises a second power control circuit connected to a second circuit of the SRAM bitcell. The second circuit comprises a second inverter. Each of the first power control circuit and the second power control circuit comprises a first switch and a second switch. The first switch associated with the first power control circuit has a first drive strength. The first switch associated with the first power control circuit is configured to be controlled by a column select line, a power control line, a second bit line associated with the second power control circuit, and a ground supply. The first switch associated with the second power control circuit has the first drive strength. The first switch associated with the second power control circuit is configured to be controlled by the column select line, the power control line, a first bit line associated with the first power control circuit, and the ground supply. The second switches associated with each of the first power control circuit and the second power control circuit have a second drive strength. The second switch is configured to be controlled by the power control line. The first switch associated with the first power control circuit and the second power control circuit are configured to be controlled using input data present on the second bit line and the first bit line, respectively, for altering the ground supply to the first inverter and the second inverter, respectively, to assist in writing the input data into the SRAM.

The foregoing summary is illustrative only and is not intended to be in any way limiting. In addition to the illustrative aspects, various example embodiments, and features described above, further aspects, example embodiments, and features will become apparent by reference to the drawings and the following detailed description.

BRIEF DESCRIPTION OF THE DRAWINGS

Further objectives and advantages of example embodiments will best be understood by reference to the following detailed description of illustrative example embodiment when read in conjunction with the accompanying figures. One or more example embodiments are now described, by way of example only, with reference to the accompanying figures wherein like reference numerals represent like elements and in which.

It should be appreciated by those of ordinary skill in the art that any block diagrams herein represent conceptual views of illustrative systems embodying the principles of the present subject matter. Similarly, it will be appreciated that any flow charts, flow diagrams, state transition diagrams, pseudo code, and the like represent various processes which may be substantially represented in computer readable medium and executed by a computer or processor, whether or not such computer or processor is explicitly shown.

DETAILED DESCRIPTION

Any embodiment and/or implementation matter described herein as "example" is not necessarily to be construed as preferred and/or advantageous over any other example embodiments.

While various example embodiments are susceptible to various modifications and/or alternative forms, various specific embodiments thereof have been shown by way of example in the drawings and will be described in detail below. It should be understood, however that it is not intended to limit the disclosure to the particular forms disclosed, but on the contrary, the disclosure is to cover all modifications, equivalents, and alternative falling within the scope of the disclosure.

The terms "comprises", "comprising", or any other variations thereof, are intended to cover a non-exclusive inclusion, such that a setup, device, or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or apparatus.

Advancement in semiconductor technology is placing constraints on design of devices such as low operating voltage. The use of Static Random-Access Memory (SRAM) in such devices may affect write margin of the SRAM. Hence, write assist techniques are used to improve the write margin of the SRAM. Conventional write assist techniques use bitcell supply voltage collapse method to help in faster writing of data to the SRAM. However, there is a contention in such techniques which may lead to an increase of dynamic power consumption.

Various example embodiments provide a write assist circuit in which a set of switches are used in the left and right circuits of SRAM bitcell (e.g., on the left and right pairs of cross-coupled inverters). The set of switches connected to each of the left and the right circuits include different drive strengths. A strength, e.g., a drive strength, of a first switch (referred as strong switch) in the set of switches is greater than a strength or a drive strength of a second switch. The first switch on each of the left and the right circuits is selectively controlled using input data present on a bit line of the SRAM, for controlling power supply provided to inverters of the SRAM bitcell. This may assist to write the input data into the SRAM.

Alternatively or additionally, some example embodiments may alter a ground supply to the inverters of the SRAM bitcell to assist in writing the input data into the SRAM. The present disclosure improves the write margin of the SRAM bitcell without affecting parameters of the SRAM such as, the operating voltage, cycle time, data retention, and the like. Various example embodiments may be useful in high-speed designs and/or in high-density memory designs. Various example embodiments may provide reduced dynamic power consumption since there is no contention due to an absence of N-channel Metal-Oxide Semiconductor (NMOS) pull down and P-channel Metal-Oxide Semiconductor (PMOS) pull up devices.

Figure 1:
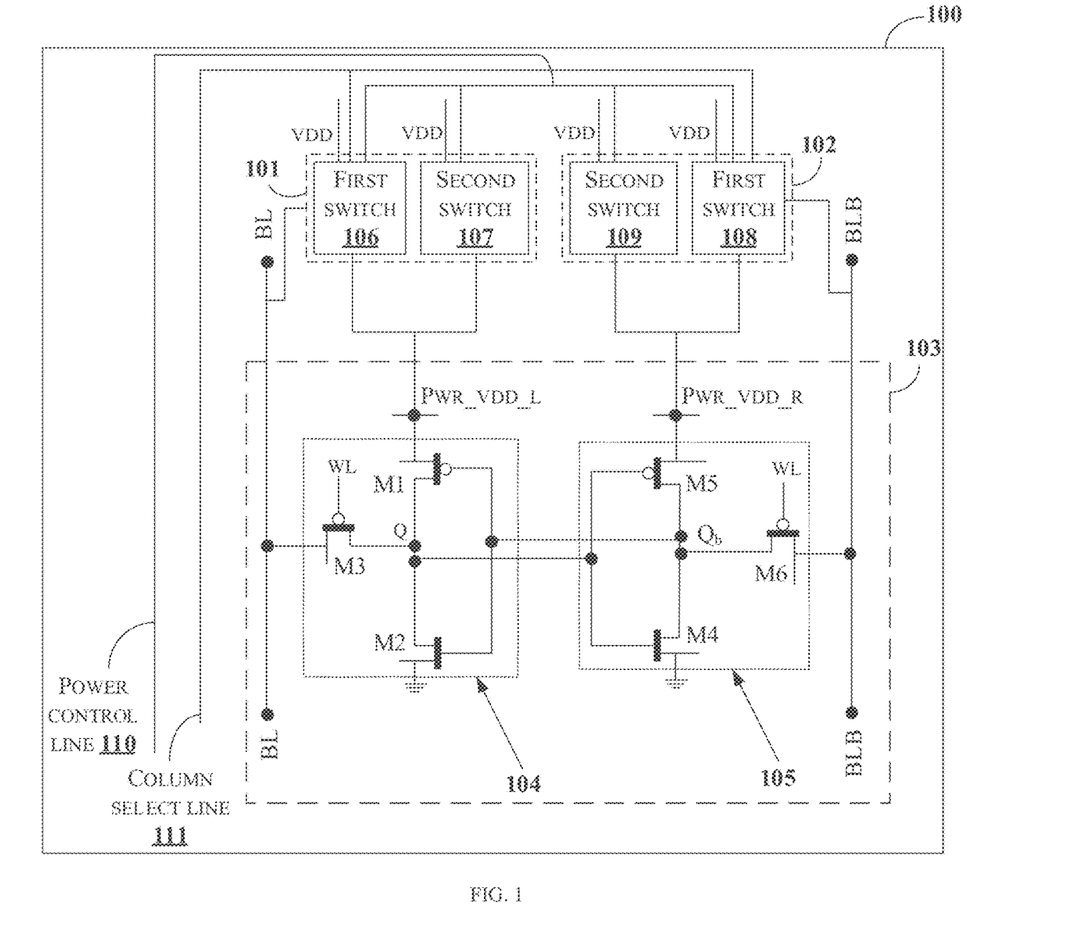
FIG. 1 illustrates various example embodiments of an example write assist circuit for SRAM, in accordance with various example embodiments.

A Static Random-Access Memory (SRAM) is a type of Random-Access Memory (RAM) that uses latching circuitry, such as flip-flops or cross-coupled inverters, to store each bit of input data. The SRAM is used in various applications, such as but not limited to one or more modern electronics equipment, microprocessors, automobile equipment, computer cache memory, and the like, for storing the input data. An SRAM cell may consist of or may include six transistors and may be known as a SRAM bitcell or a six-transistor (6T) SRAM bitcell. An SRAM bitcell shown as 103 in FIG. 1 illustrates various example embodiments of an example write assist circuit 100 for the SRAM, in accordance with various example embodiments. Each bit in the SRAM bitcell 103 is stored on four transistors (M1, M2, M4, M5). Transistors M1, M2, and M3 form or correspond to a left circuit of the SRAM bitcell 103 and may be referred to as a first circuit 104. Transistors M4, M5, and M6 form or correspond to a right circuit of the SRAM bitcell 103 and may be referred to as a second circuit 105. The transistors M1 and M2 of the first circuit 104 form or correspond to a first inverter having a pullup transistor M1 and a pulldown transistor M2. The first inverter is a cross-coupled inverter. The transistors M4 and M5 of the second circuit 105 form or correspond to a second inverter having a pullup transistor M5 and a pulldown transistor M4. The second inverter is a cross-coupled inverter that is cross-coupled to the first inverter. The SRAM bitcell 103 has two stable states Q and $Q_b$ which may denote "0" and "1". The first circuit 104 comprises a first access transistor M3 and the second circuit 105 comprises a second access transistor M6. The access transistors M3 and M6 serve to control access to the SRAM bitcell 103 during read and write operations. Access to the SRAM bitcell 103 is enabled by word lines (WL in FIG. 1) which controls the access transistors M3 and M6 which, in turn, control whether the SRAM bitcell 103 is to be connected to a first bit line BL and a complementary or barred second bit line BLB. The first bit line BL and the second bit line BLB are used to transfer data for both read and write operations. Example embodiments are explained considering 6T configuration of the SRAM bitcell 103; however, example embodiments are not limited thereto, and other configurations such as 4T, 8T, 10T configurations may be considered.

Writing of the input data into the SRAM bitcell 103 needs to be or is desired to be efficient and/or fast for applications such as high-speed devices. To provide more efficient and faster writing, a write margin of the SRAM may be improved. The write margin of the SRAM is the measure of the ability to write the input data into the SRAM bitcell 103. Various example embodiments provide the write assist circuit 100 comprising a first power control circuit 101 connected to the first circuit 104 and a second power control circuit 102 connected to the second circuit 105. Each of the first power control circuit 101 and the second power control circuit 102 comprises a first switch 106, 108 and a second switch 107, 109. The first switch 106, 108 and the second switch 107, 109 may have different drive strengths for altering power supply to the first inverter and the second inverter, based on the input data present on bit lines of the SRAM. Alternatively or additionally, the first switch 106, 108 and the second switch 107, 109 may have different drive strengths for altering ground supply to the first inverter and the second inverter, based on the input data present on bit lines of the SRAM. Different example embodiments are further explained in detail in the present description.

FIG. 1 illustrates various example embodiments of an example write assist circuit 100 for the SRAM, in accordance with various example embodiments. The write assist circuit 100 for the SRAM comprises the first power control circuit 101 connected to the first circuit 104 of the SRAM bitcell 103. The first power control circuit 101 is connected between power supply VDD of the SRAM and the first inverter of the first circuit 104. Further, the write assist circuit 100 comprises the second power control circuit 102 connected to the second circuit 105 of the SRAM bitcell 103. The second power control circuit 102 is connected between the power supply VDD and the second inverter of the second circuit 105. Each of the first power control circuit 101 and the second power control circuit 102 comprises a first switch 106, 108 and a second switch 107, 109. The first switches 106, 108 associated with each of the first power control circuit 101 and the second power control circuit 102 have a first drive strength. Drive strength of a logic gate is its relative capability to charge/discharge capacitance present at output. The second switches 107, 109 associated with each of the first power control circuit 101 and the second power control circuit 102, have a second drive strength. In various example embodiments, the first switches 106, 108 include a PMOS transistor. In various example embodiments, the second switch 107 associated with the first power control circuit 101 includes two PMOS transistors in series which are connected between the power supply VDD and the first inverter. In various example embodiments, the second switch 109 associated with the second power control circuit 102 includes two PMOS transistors in series which are connected between the power supply VDD and the second inverter. Since the two PMOS transistors are connected in series, an effective length of the transistors increases, a strength of the transistors decreases, and thus current flow through the two PMOS transistors is reduced. Hence, the second drive strength of the second switches 107, 109 is less than the first drive strength of the first switches 106, 108. For example, the first switches 106, 108 are strong switches and the second switches 107, 109 are weak switches. The second switches 107, 109 may include more than two PMOS transistors based on implementation of the SRAM.

The first switch 106 associated with the first power control circuit 101 is controlled by a column select line 111, a power control line 110, the first bit line BL, and the power supply VDD. A value on power control line 110 is "0" and a value on the column select line 111 is "1" during writing the input data into the SRAM. In various example embodiments, a NOR gate (not illustrated) is used between or for control of the column select line 111 and the first switch 106. The first switch 108 associated with the second power control circuit 102 is controlled by the column select line 111, the power control line 110, the second bit line BLB, and the power supply VDD. In various example embodiments, a NOR gate (not illustrated) is used between or for control of the column select line 111 and the first switch 108. Example embodiments are not limited thereto, and any logic gates and/or any other combinations of the logic gates other than the above-mentioned logic gates may be used. The second switches 107, 109 associated with each of the first power control circuit 101 and the second power control circuit 102, are controlled by the power control line 110. The second switches 107, 109 are controlled by the power control line 110 which has a value "0" during writing the input data into the SRAM. Hence, the second switch 107, 109 are in ON state, when writing the input data into the SRAM.

Further, when the input data to be written in the SRAM is "0", the input data on the first bit line is "0". An input "1" is provided to the first switch 106 associated with the first power control circuit 101. This may disable the first switch 106. Hence, the first switch 106 is in an OFF state and the second switch 107 is in an ON state. For example, the strong switch is in an OFF state, and the weak switch is in an ON state, thereby altering the power supply VDD to the first inverter. This may reduce strength of the transistor M1, thereby assisting to write the input data into the SRAM. When the input data to be written in the SRAM is "1", the input data on the first bit line BL is "1". A value on the second bit line BLB is "0". An input "1" is provided to the first switch 108 associated with the second power control circuit 102. This disables the first switch 108. Hence, the first switch 108 is in OFF state and the second switch 109 is in ON state. For example, the strong switch is in an OFF state, and the weak switch is in an ON state, thereby altering the power supply VDD to the second inverter. This may reduce strength of the transistor M5, thereby assisting to write the input data into the SRAM. Hence, the first switches 106, 108 associated with the first power control circuit 101 and the second power control circuit 102 are controlled using the input data present on the first bit line BL and the second bit line BLB, respectively, for altering the power supply to the first inverter and the second inverter, respectively, to assist in writing the input data into the SRAM.

Figure 2:
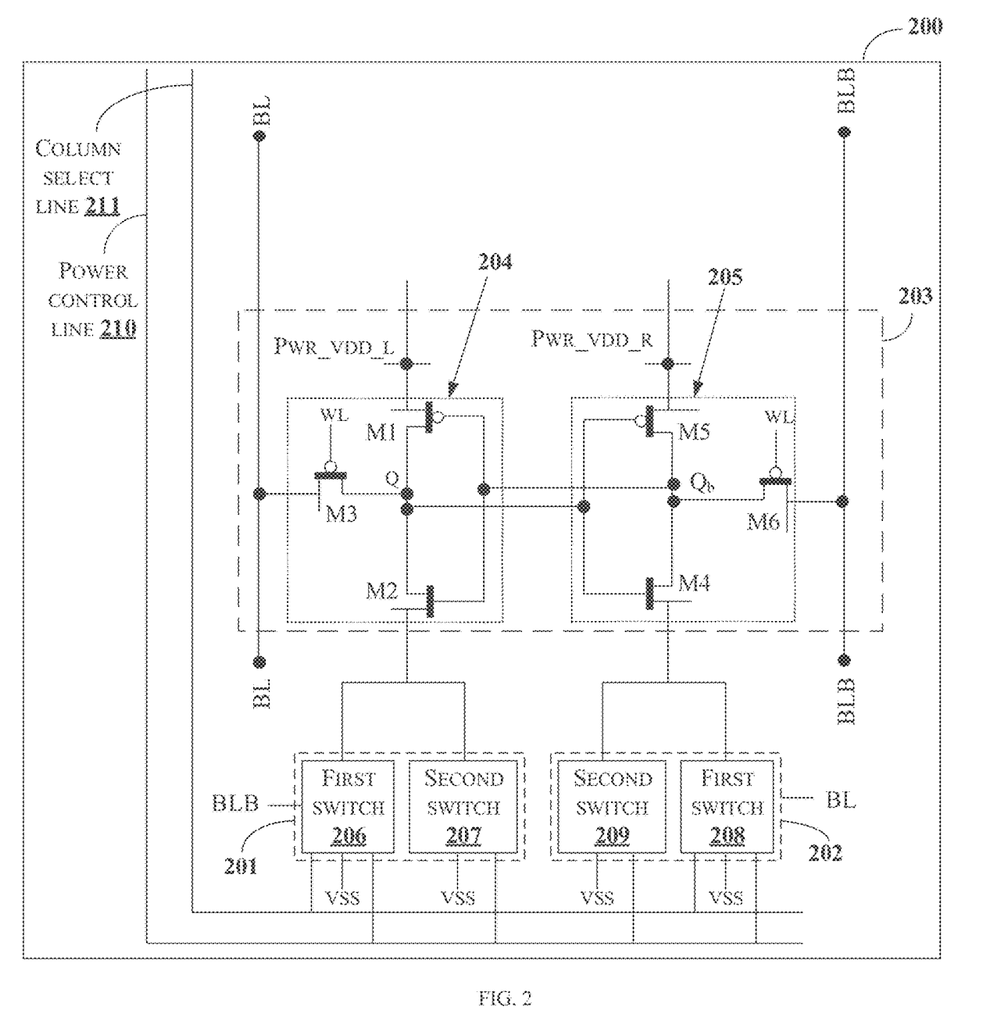
FIG. 2 shows another embodiment of an example write assist circuit for SRAM, in accordance with various example embodiments.

FIG. 2 illustrates an example write assist circuit 200 for the SRAM, in accordance with various example embodiments. The write assist circuit 200 for the SRAM comprises the first power control circuit 201 connected to the first circuit 204 of the SRAM bitcell 203. The first power control circuit 201 is connected between ground supply VSS of the SRAM and the first inverter of the first circuit 204. Further, the write assist circuit 200 comprises the second power control circuit 202 connected to the second circuit 205 of the SRAM bitcell 203. The second power control circuit 202 is connected between the ground supply VSS and the second inverter of the second circuit 205. The first power control circuit 201 and the second power control circuit 202 comprise first switches 206, 208 and a second switches 207, 209. Each of the first switch 206 associated with the first power control circuit 201 and the first switch 208 associated with the second power control circuit 202 has a first drive strength. The second switch 207 associated with the first power control circuit 201 and the second switch 209 associated with the second power control circuit 202 has a second drive strength. In various example embodiments, the first switch 206, 208 includes a NMOS transistor. In various example embodiments, the second switch 207 associated with the first power control circuit 201 includes two NMOS transistors in series, which are connected between ground and the first inverter. In various example embodiments, the second switch 209 associated with the second power control circuit 202 includes two NMOS transistors in a series which are connected between the ground and the second inverter. Since the two NMOS transistors are in series, the effective length of transistors increases, a strength of the transistors decreases, and thus a flow of current through the two NMOS transistors reduces. Hence, the second drive strength of the second switch 207, 209 is less than the first drive strength of the first switch 206, 208. In other words, the first switch 206, 208 is a strong switch and the second switch 207, 209 is a weak switch. Example embodiments are not limited thereto, and the second switch 207, 209 may include more than two NMOS transistors based on implementation of the SRAM.

The first switch 206 associated with the first power control circuit 201 is controlled by a column select line 211, a power control line 210, the second bit line BLB, and the ground supply VSS. The value on power control line 210 is "0" and the value on the column select line 211 is "1" during writing the input data into the SRAM. In various example embodiments, a NOR gate (not illustrated) and an inverter (not illustrated) is used between or for control of the column select line 211 and the first switch 206. The first switch 208 associated with the second power control circuit 202 is controlled by the column select line 211, the power control line 210, the first bit line BL, and the ground supply VSS. In various example embodiments, a NOR gate (not illustrated) and an inverter (not illustrated) is used between or for control of the column select line 211 and the first switch 208. Example embodiments are not limited thereto, and any logic gates or any other combinations of the logic gates other than the above-mentioned logic gates may be used. The second switch 207, 209 associated with each of the first power control circuit 201 and the second power control circuit 202, is controlled by the power control line 210. The second switch 207, 209 is controlled by the power control line 210 which has a value "0" during writing the input data into the SRAM. The power control line 210 is connected to the second switch 207, and 209 through a NOT gate (not illustrated). Hence, the second switch 207, 209 are in ON state, when writing the input data into the SRAM.

When the input data to be written in the SRAM is "0", the input data on the first bit line is "0". An input "0" is provided to the first switch 208 associated with the second power control circuit 202. This disables the first switch 208. Hence, the first switch 208 is in an OFF state and the second switch 209 is in an ON state. In other words, the strong switch is in OFF state, and the weak switch is in an ON state, thereby altering the ground supply VSS to the second inverter. This reduces strength of the transistor M4. This in turn increases strength of transistors M5 and M6 which assists M2 to flip a value of Q to "0", thereby assisting to write the input data into the SRAM. When the input data to be written in the SRAM is "1", the input data on the first bit line BL is "1". A value on the second bit line BLB is "0". An input "0" is provided to the first switch 206 associated with the first power control circuit 201. This disables the first switch 206. Hence, the first switch 206 is in OFF state and the second switch 207 is in ON state. For example, the strong switch is in an OFF state, and the weak switch is in an ON state, thereby altering the ground supply VSS to the first inverter. This reduces strength of the transistor M2. This in turn increases strength of transistor M1 and M3, which assists M4 to flip a value of $Q_b$ to "0" and assists M1 to flip a value of Q to "1", thereby assisting to write the input data into the SRAM. Hence, the first switch 206, 208 associated with the first power control circuit 201 and the second power control circuit 202 are controlled using input data present on the second bit line and the first bit line, respectively, for altering the ground supply to the first inverter and the second inverter, respectively, to assist in writing the input data into the SRAM.

Figure 3A:
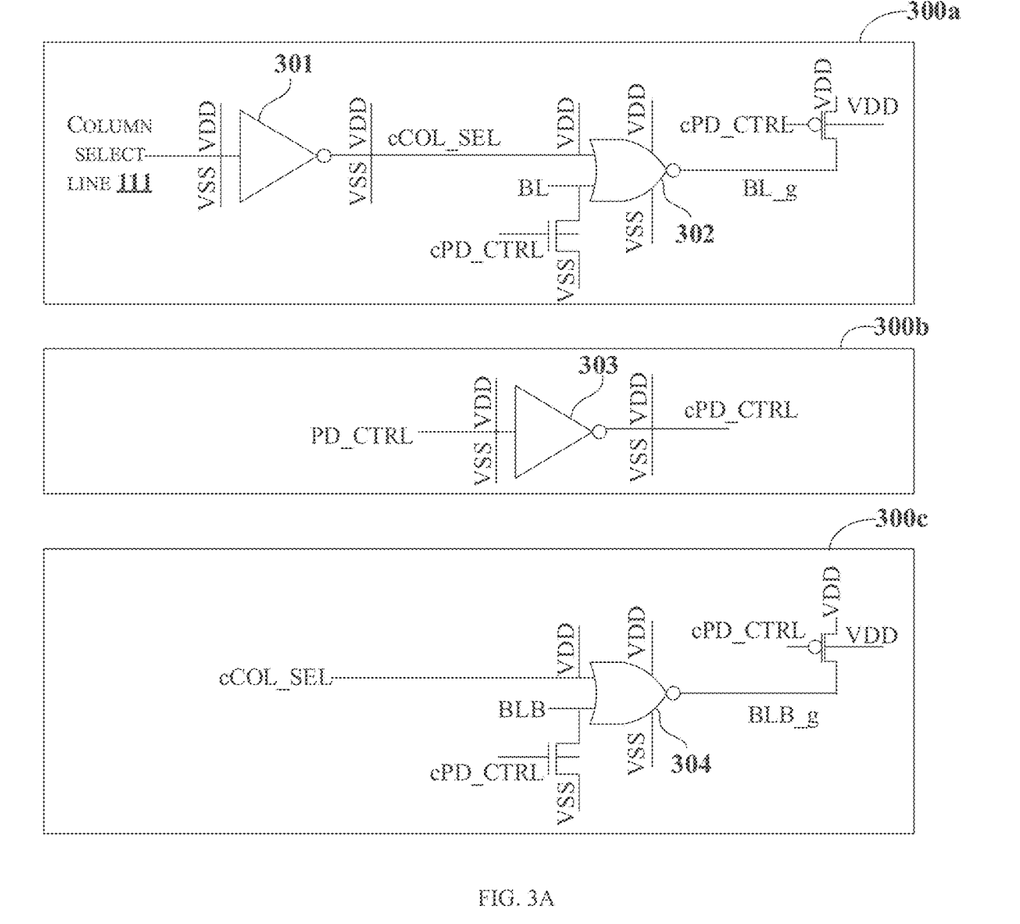
FIGS. 3A and 3B illustrate an example implementation of a write assist circuit for SRAM, in accordance with various example embodiments.
Figure 3B:
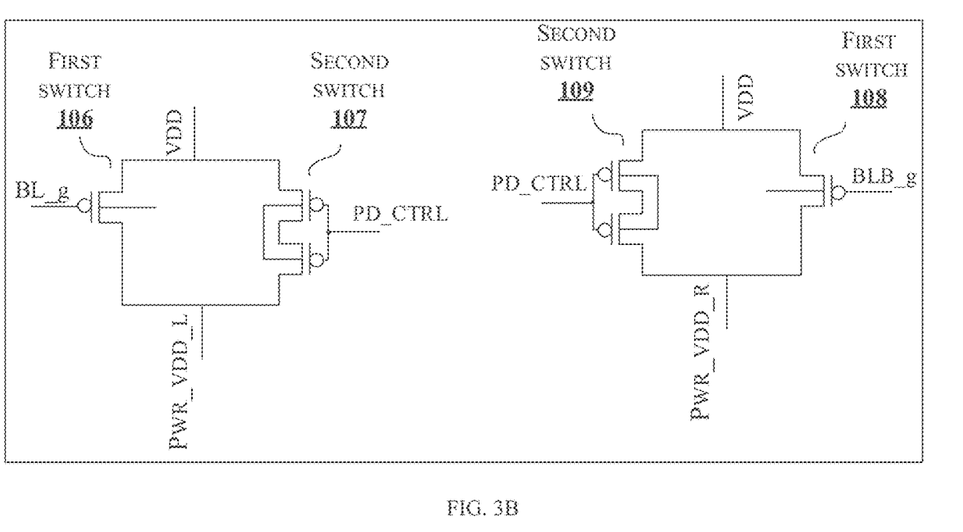
Figure 3C:
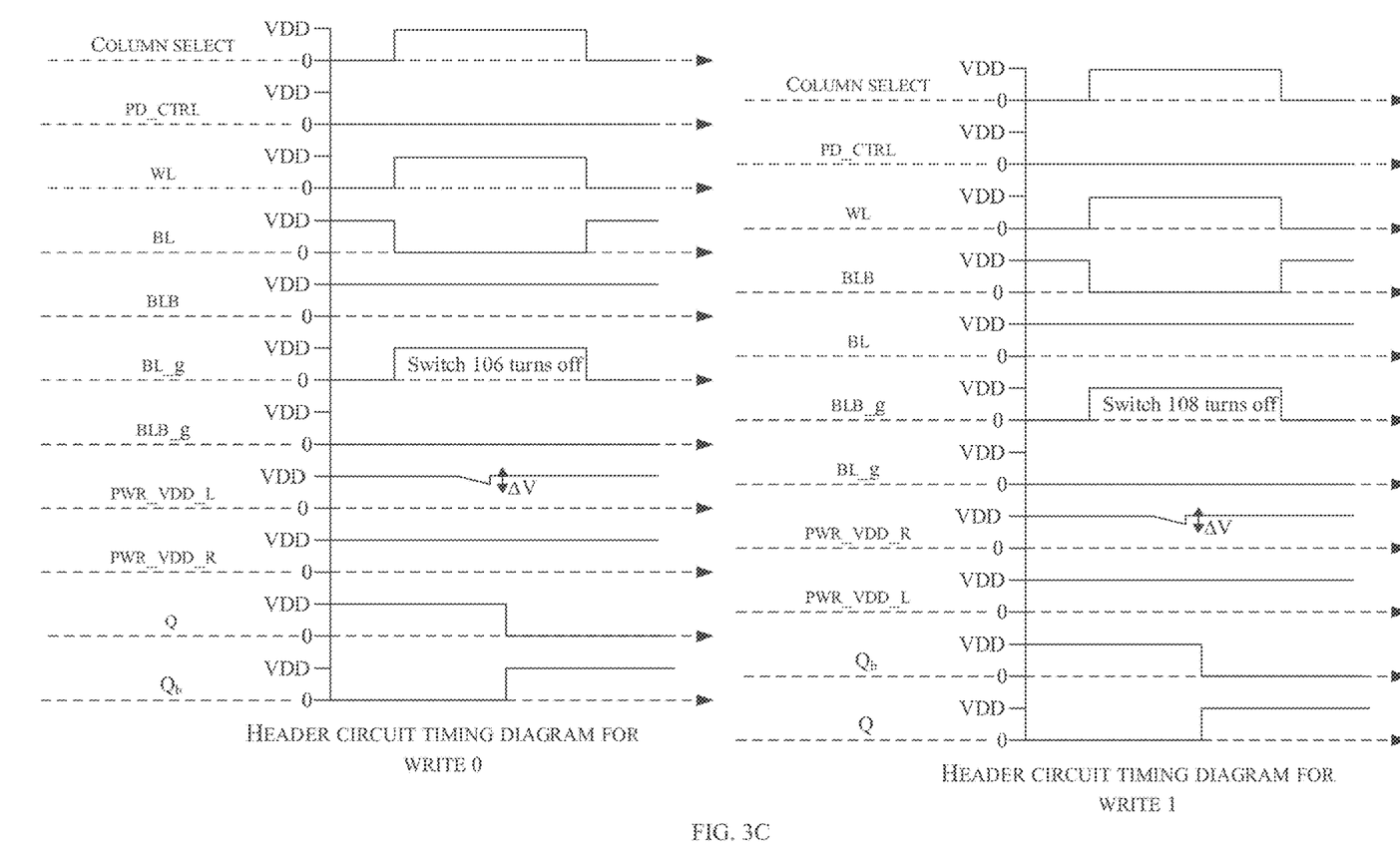
FIG. 3C illustrates an example signal behaviour of the write assist circuit for SRAM, in accordance with various example embodiments.

FIG. 3A illustrates an example implementation of generating enable signals for the write assist circuit 100 for the SRAM, in accordance with various example embodiments. In various example embodiments, the write assist circuit 100 may include, but is not limited to, the column select line 111, NOT gates 301 and 303, NOR gates 302 and 304, the power control line 110 (illustrated as PD_CTRL in FIG. 3A), the NMOS transistors, and the PMOS transistors. The value on the power control line 110 is "0" during writing the input data into the SRAM. The power control line 110 is connected to the NOT gate 303 as shown in 300b in FIG. 3A to generate a signal cPD_CTRL with a value "1". Referring to 300a in FIG. 3A, the column select line 111 is connected to the NOT gate 301. Hence, a signal cCOL_SEL with a value "0" is output from the NOT gate 301. When the input data to be written in the SRAM is "0", the value on the first bit line is "0" and the value on the second bit line is "1". The output from the NOT gate 301 and the first bit line are provided as inputs to the NOR gate 302. The value "1" is provided as an output from the NOR gate 302 to the PMOS transistor. The PMOS transistor may be a part of the first switch 106 associated with the first power control circuit 101 as elaborated in FIG. 3B. As the value "1" is provided to the first switch 106 associated with the first power control circuit 101, the first switch 106 is OFF which reduces strength of the transistor M1 in the first circuit 104, thereby assisting to write the input data into the SRAM. When the input data to be written in the SRAM is "1", the input data on the first bit line BL is "1". A value on the second bit line BLB is "0". The value "1" is provided as an output from the NOR gate 304 to the PMOS transistor, as the signal cCOL_SEL with value "0" and the second bit line with value "0" are provided as inputs to the NOR gate 304 (refer to 300c in FIG. 3A). The PMOS transistor is a part of the first switch 108 associated with the second power control circuit 102 as elaborated in FIG. 3B. This disables the first switch 108 associated with the second power control circuit 102, which reduces strength of the transistor M5, thereby assisting to write the input data into the SRAM. This is explained as an example signal behaviour of the write assist circuit for SRAM in FIG. 3C.

Figure 4A:
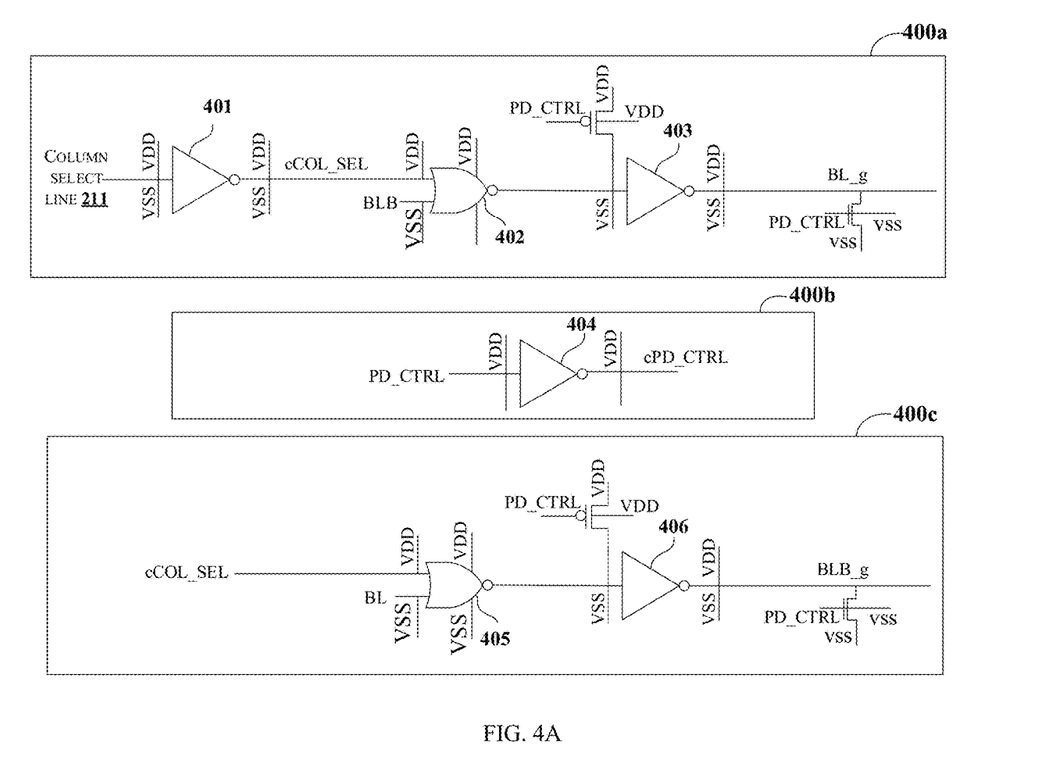
FIGS. 4A and 4B illustrate another example implementation of a write assist circuit for SRAM, in accordance with various example embodiments.
Figure 4B:
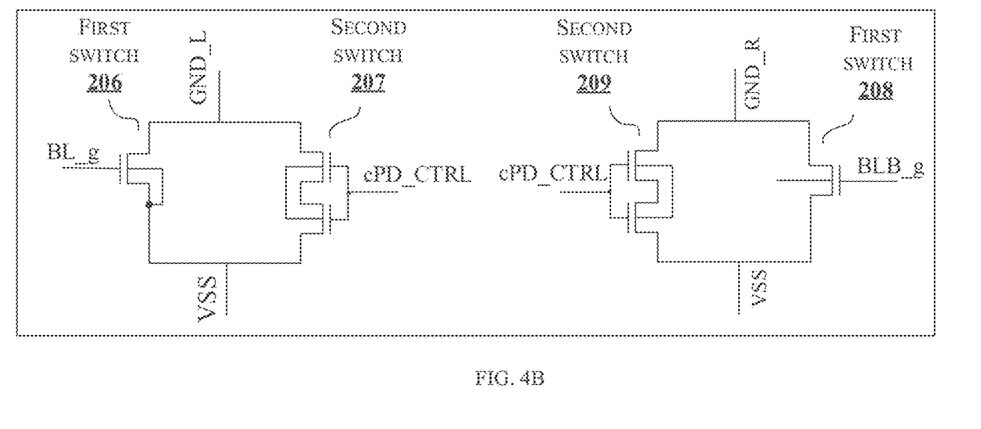
Figure 4C:
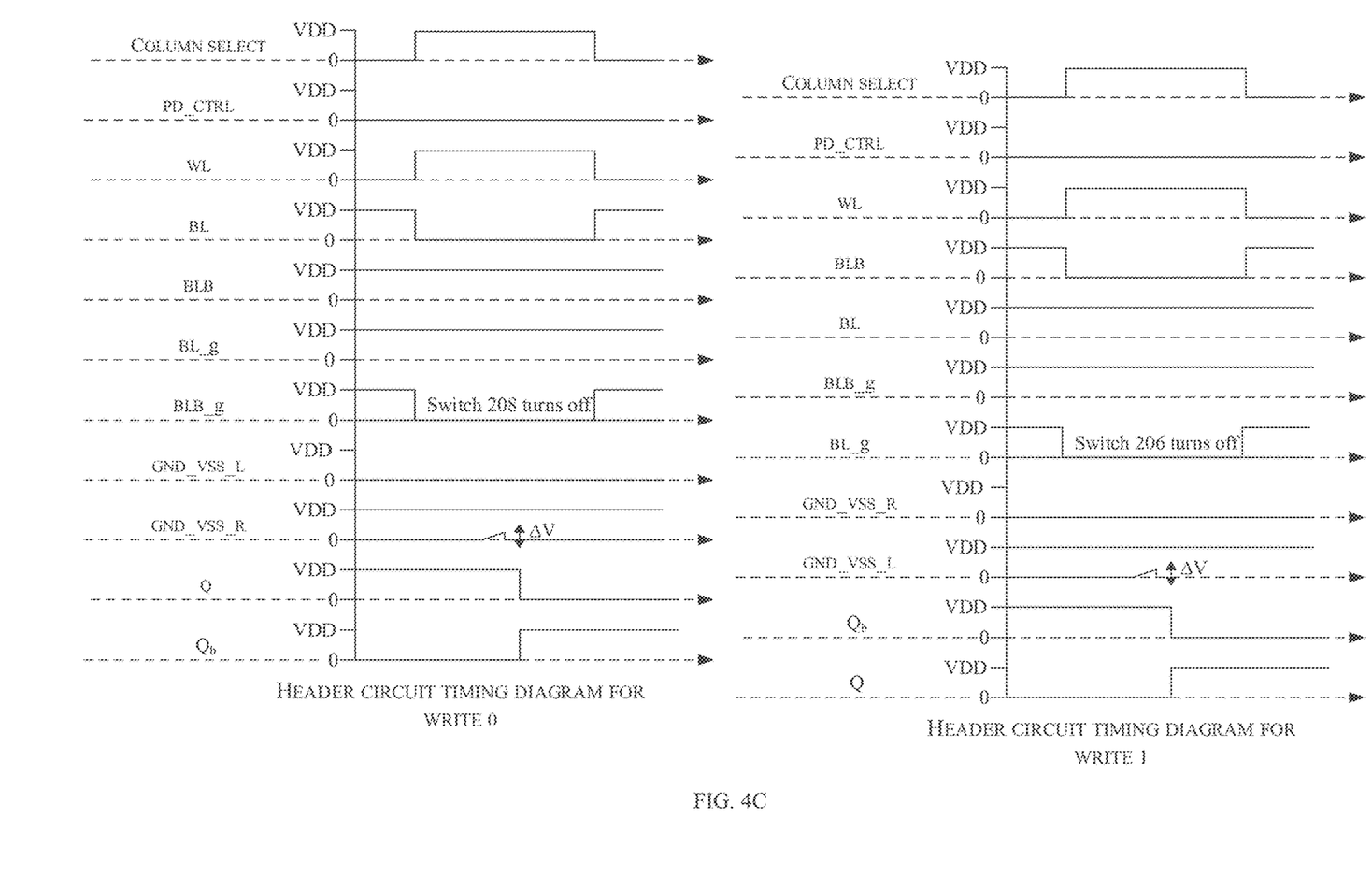
FIG. 4C illustrates another example signal behaviour of the write assist circuit for SRAM, in accordance with various example embodiments.

FIG. 4A illustrates another example implementation of generating enable signals for the write assist circuit 200 for the SRAM, in accordance with various example embodiments. In various example embodiments, the write assist circuit 200 may include, but is not limited to, the column select line 211, NOT gates 401, 403, 404, and 406, NOR gates 402 and 405, the power control line 210, the NMOS transistors, and the PMOS transistors. The value on the power control line 210 is "0" during writing the input data into the SRAM. The value "1" is provided as an output from the NOT gate 404 as shown in 400b in FIG. 4A to generate a signal cPD_CTRL with a value "1". The signal cPD_CTRL is provided to the NMOS transistor, which is a part of the second switch 207, 209 associated with the first power control circuit 201 and the second power control circuit, respectively. The value on the column select line 211 is "1" during writing the input data into the SRAM. The column select line 211 is connected to the NOT gate 401. Hence, a signal cCOL_SEL with a value "0" is output from the NOT gate 401. When the input data to be written in the SRAM is "0", the value on the first bit line is "0" and the value on the second bit line is "1". The value "0" is provided as an output from the NOR gate 402 to the NOT gate 403, as the value of the cCOL_SEL is "0" and the value on the second bit line is "1" (refer to 400a in FIG. 4A). The value of "1" is provided as an output from the NOT gate 403 to the NMOS transistor. The NMOS transistor is a part of the first switch 206 associated with the first power control circuit 201 as elaborated in FIG. 4B. The NMOS transistor switches to an ON state, thus switching ON the first switch 206 associated with the first power control circuit 201 and switching OFF the first switch 208 associated with the second power control circuit 202. This reduces strength of the transistor M4. This in turn increases strength of transistor M5 and M6, which assists M2 to flip a value of Q to "0", thereby assisting to write the input data into the SRAM. When the input data to be written in the SRAM is "1", the value "0" is provided as the output from the NOR gate 405, as the signal cCOL_SEL with value "0" and the first bit line with value "1" are inputs to the NOR gate 405 (refer to 400c in FIG. 4A). The output of the NOR gate 405 is provided as an input to the NOT gate 406. Hence, the value of "1" is provided as an output from the NOT gate 406 to the NMOS transistor. The NMOS transistor is a part of the first switch 208 associated with the second power control circuit 201 elaborated in FIG. 4B. The NMOS transistor switches to an ON state, thus switching ON the first switch 208 associated with the second power control circuit 202 and switching OFF the first switch 206 associated with the first power control circuit 201. This reduces strength of the transistor M2 connected to the first switch 206 associated with the first power control circuit 201. This in turn may increase strength of transistor M1 and M3, which assists M4 to flip a value of $Q_b$ to "0" and assists M1 to flip a value of Q to "1", thereby assisting to write the input data into the SRAM. This is explained as an example signal behaviour of the write assist circuit for SRAM in FIG. 4C. Generation of the enable signals may include implementations other than the example implementations illustrated in FIGS. 3A and 4A, and example embodiments are not limited thereto.

Figure 5:
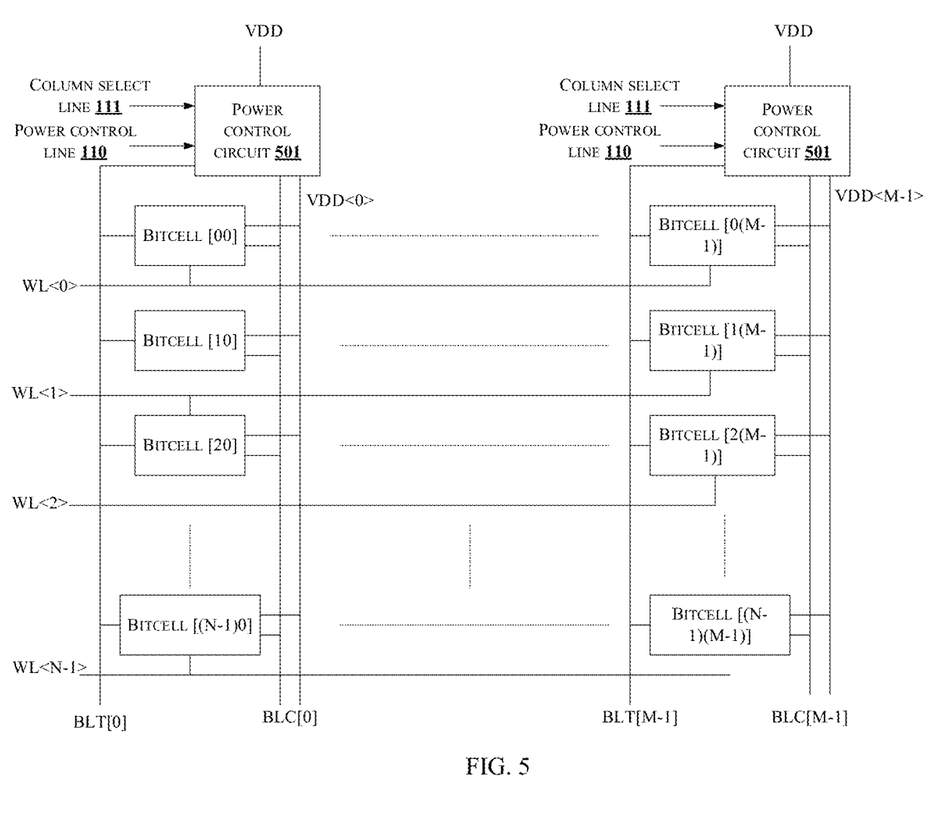
FIG. 5 illustrates an example connection of a write assist circuit in a SRAM array, in accordance with various example embodiments.

FIG. 5 illustrates an example connection of a write assist circuit in a SRAM array, in accordance with various example embodiments. FIG. 5 illustrates a N×M SRAM array, comprises 'N' rows and 'M' columns of SRAM bit cells. The SRAM bit cells are connected to 'N' word lines WL and bit lines BLT. The first power control circuit 101, 201 and the second power control circuit 102, 202 are illustrated as a power control circuit 501 which is connected to each of the columns inside the SRAM array, to assist in writing the input data into the SRAM.

Some example embodiments provide a write assist circuit in which a set of strong and weak switches are used are used in a first circuit and a second circuit of SRAM bitcell. The set of switches have different drive strengths, for example because of different transistor lengths. The strong switches on each of the first circuit and the second circuit are selectively controlled using input data present on bit line of the SRAM, for controlling power supply/ground supply provided to inverters of the SRAM bitcell. This may assist to write the input data into the SRAM. Example embodiments may improve the write margin of the SRAM bitcell without affecting parameters of the SRAM such as the operating voltage, cycle time, data retention, and the like. Example embodiments may be useful in high-speed designs and/or high-density memory designs. Alternatively, or additionally, example embodiments provide reduced dynamic power consumption since there is no contention due to an absence of N-channel Metal-Oxide Semiconductor (NMOS) pull down and P-channel Metal-Oxide Semiconductor (PMOS) pull up, e.g., within a write assist circuit.

The terms "various example embodiments", "embodiment", "embodiments", "the embodiment", "the embodiments", "one or more embodiments", "some embodiments", and "one embodiment" mean "one or more (but not all) embodiments of the invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise. The terms "a", "an" and "the" may mean "one or more", unless expressly specified otherwise or otherwise clear from context.

A description of various example embodiments with several components in communication with each other does not imply that all such components are required. On the contrary a variety of optional components are described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it may be readily apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other example embodiments may or may not include the device itself.

Finally, the language used has been principally selected for readability and instructional purposes, and it may not have been selected to delineate or circumscribe inventive subject matter. It is therefore intended that the scope of the invention be limited not by this detailed description, but rather by any claims that issue on an application based here on. Accordingly, the disclosure various example embodiments is intended to be illustrative, but not limiting, of the scope of the invention, which is set forth in the following claims.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While various aspects and embodiments have been disclosed herein, other aspects and embodiments will be apparent to those of ordinary skill in the art. The various aspects and example embodiments disclosed herein are for purposes of illustration and are not intended to be limiting, with the true scope being indicated by the following claims. Furthermore, example embodiments are not necessarily mutually exclusive with one another. For example, some example embodiments may include one or more features described with reference to one or more drawings and may also include one or more other features described with reference to one or more other drawings.

We claim:

1. A write assist circuit for a Static Random-Access Memory (SRAM), comprising:
a first power control circuit connected to a first circuit of an SRAM bitcell, wherein the first circuit comprises a first inverter; and
a second power control circuit connected to a second circuit of the SRAM bitcell, wherein the second circuit comprises a second inverter,
wherein each of the first power control circuit and the second power control circuit comprises a first switch and a second switch;
the first switch associated with the first power control circuit has a first drive strength and is configured to be controlled by a column select line, a power control line, a first bit line, and a power supply,
the first switch associated with the second power control circuit has the first drive strength, and is configured to be controlled by the column select line, the power control line, a second bit line, and the power supply,
the second switches associated with each of the first power control circuit and the second power control circuit have a second drive strength, and are configured to be controlled by the power control line, and
the first switches associated with the first power control circuit and the second power control circuit are configured to be controlled using input data present on the first bit line and on the second bit line, respectively, the input data altering the power supply to the first inverter and the second inverter, respectively.

2. The write assist circuit as claimed in claim 1, wherein the first drive strength is greater than the second drive strength.

3. The write assist circuit as claimed in claim 1, wherein the first circuit further comprises a first access transistor and the second circuit further comprises a second access transistor.

4. The write assist circuit as claimed in claim 1, wherein the second switch associated with the first power control circuit and the second power control circuit are configured to be in an ON state, in response to writing the input data into the SRAM.

5. The write assist circuit as claimed in claim 1, wherein the first switch associated with the first power control circuit is configured to be in an OFF state, in response to the input data on the first bit line being "0".

6. The write assist circuit as claimed in claim 1, wherein the first switch associated with the second power control circuit is configured to be in an OFF state, in response to the input data on the first bit line being "1".

7. The write assist circuit as claimed in claim 1, wherein the first power control circuit is connected between the power supply and to the first inverter of the first circuit, and the second power control circuit is connected between the power supply and to the second inverter of the second circuit.

8. A write assist circuit for a Static Random-Access Memory (SRAM), comprising: a first power control circuit connected to a first circuit of an SRAM bitcell, wherein the first circuit comprises a first inverter; and a second power control circuit connected to a second circuit of the SRAM bitcell, wherein the second circuit comprises a second inverter, wherein each of the first power control circuit and the second power control circuit comprises a first switch and a second switch; the first switch associated with the first power control circuit has a first drive strength, and is configured to be controlled by a column select line, a power control line, a second bit line associated with the second power control circuit, and a ground supply; the first switch associated with the second power control circuit has the first drive strength, and is configured to be controlled by the column select line, the power control line, a first bit line associated with the first power control circuit, and the ground supply; the second switches associated with each of the first power control circuit and the second power control circuit have a second drive strength, and are configured to be controlled by the power control line, and wherein the first switches associated with the first power control circuit and the second power control circuit are configured to be controlled using input data present on the second bit line and the first bit line, respectively, the input data altering the ground supply to the first inverter and the second inverter, respectively.

9. The write assist circuit as claimed in claim 8, wherein the first drive strength is greater than the second drive strength.

10. The write assist circuit as claimed in claim 8, wherein the first circuit further comprises a first access transistor, and the second circuit further comprises a second access transistor.

11. The write assist circuit as claimed in claim 8, wherein the second switches associated with the first power control circuit and the second power control circuit are configured to be in an ON state, in response to writing the input data into the SRAM.

12. The write assist circuit as claimed in claim 8, wherein the first switch associated with the second power control circuit is configured to be in an OFF state, in response to the input data on the first bit line being "0".

13. The write assist circuit as claimed in claim 8, wherein the first switch associated with the first power control circuit is configured to be in an OFF state, in response to the input data on the first bit line being "1".

14. The write assist circuit as claimed in claim 8, wherein the first power control circuit is connected between the ground supply and the first inverter of the first circuit and the second power control circuit is connected between the ground supply and the second inverter of the second circuit.

* * * * *